United States Patent
Vo

(10) Patent No.: US 10,528,685 B2
(45) Date of Patent: Jan. 7, 2020

(54) EFFICIENT MECHANISM IN HARDWARE AND SOFTWARE CO-SIMULATION SYSTEM

(71) Applicant: Synopsys, Inc., Mountain View, CA (US)

(72) Inventor: Jefferry Phuong Vo, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 356 days.

(21) Appl. No.: 14/732,481

(22) Filed: Jun. 5, 2015

(65) Prior Publication Data

US 2015/0356219 A1 Dec. 10, 2015

Related U.S. Application Data

(60) Provisional application No. 62/009,105, filed on Jun. 6, 2014.

(51) Int. Cl.
*G06F 17/50* (2006.01)

(52) U.S. Cl.
CPC ................. *G06F 17/5022* (2013.01)

(58) Field of Classification Search
CPC .................................................. G06F 17/5022
See application file for complete search history.

(56) References Cited

U.S. PATENT DOCUMENTS

| | | |
|---|---|---|
| 5,768,567 A | 6/1998 | Klein et al. |
| 5,771,370 A | 6/1998 | Klein |
| 6,212,489 B1 | 4/2001 | Klein et al. |
| 6,470,481 B2 | 10/2002 | Brouhard et al. |
| 7,072,820 B1 | 7/2006 | Bailey et al. |
| 7,143,369 B1 | 11/2006 | Milne et al. |
| 7,366,651 B1 | 4/2008 | Milne et al. |
| 7,673,265 B2 | 3/2010 | Akiba et al. |
| 7,711,535 B1 | 5/2010 | Brookes et al. |

(Continued)

OTHER PUBLICATIONS

Andrews, J. R., Chapter 5—Advanced Hardware/Software Co-Verification, In Co-verification of Hardware and Software for ARM SoC Design, Newnes, Burlington, 2005, pp. 165-195, ISBN 9780750677301, https://doi.org/10.1016/B978-075067730-1/50010-4. <URL: http://www.sciencedirect.com/science/article/pii/B9780750677301500104>.*

(Continued)

*Primary Examiner* — Bijan Mapar
(74) *Attorney, Agent, or Firm* — Fenwick & West LLP

(57) ABSTRACT

The described embodiments provide an efficient mechanism for performing hardware and software co-simulation that greatly simplifies system implementation, and improves the user controllability and ease-of-use. The mechanism includes the hardware and software co-simulators synchronizing at finite and predetermined synchronization points (e.g., five synchronization points) without using polling or busy-wait techniques. The hardware and software co-simulators run freely and independently from each other until one of the synchronization points is reached. At such point the simulators can communicate and/or control other simulation states, thereby reducing the amount of communication and control between the simulators.

20 Claims, 4 Drawing Sheets

(56) References Cited

U.S. PATENT DOCUMENTS

| | | | |
|---|---|---|---|
| 8,352,231 B2 | 1/2013 | Babinsky et al. | |
| 8,473,269 B1 | 6/2013 | Ou et al. | |
| 8,549,468 B2* | 10/2013 | Wu | G06F 8/53 717/100 |
| 2002/0032559 A1 | 3/2002 | Hellestrand et al. | |
| 2005/0198606 A1* | 9/2005 | Gupta | G01B 31/31831 716/104 |
| 2008/0177522 A1* | 7/2008 | Bolding | G06F 17/5009 703/13 |
| 2011/0191092 A1 | 8/2011 | Mizrachi et al. | |

OTHER PUBLICATIONS

ARM, Understanding ARM11 Processor Power Saving Modes, Application Note 143, Oct. 2007 [retrieved on Jul. 25, 2017]. Retrieved from the Internet: <URL: http://infocenter.arm.com/help/topic/com.arm.doc.dai0143c/DAI0143C_understanding_arm11_power_saving_modes.pdf>.*

Benini, L., Bertozzi, D., Bruni, D., Drago, N., Fummi, F., & Poncino, M. (2003). SystemC cosimulation and emulation of multiprocessor SoC designs. Computer, 36(4), 53-59. (Year: 2003).*

Cadence Web Page, Cadence Design Systems, Inc., 2015, 1 page, [Online] [Retrieved on Sep. 29, 2015] Retrieved from the Internet<URL:http://w2.cadence.com/whitepapers/Coverification_wp.pdf>.

Chung, M-K. et al., "Enhancing Performance of HW/SW Cosimulation and Coemulation of Reducing Communication Overhead," IEEE Transactions on Computers, Feb. 2006, pp. 125-136, vol. 55. No. 2.

Rittman, D., "Hardware/Software Co-Verification & Co-Simulation," Dec. 2004, 13 pages, May be retrieved at<URL:http://www.tayden.com/publications/HardwareSoftware%20Co-verification.pdf.

Rowson, J.A., "Hardware/Software Co-Simulation," 2006, May be retrieved at<URL: http://www.cas.mcmasterca/~sancheg/EE_UCU2006_thesis/biblio/Hardware-Software%2000-Simulation%20(27_3).pdf>.

Stoy, E. et al., "Hardware/Software Co-Simulation Using a Unified Design Representation," Proceedings of DSA495, May 1995, 3 pages.

Ghosh, A. et al., "A Hardware-Software Co-Simulator for Embedded System Design and Debugging," ASP-DAC 95, 1995, 10 pages, May be retrieved at<URL: http://www.cecs.uci.edu/~papers/compendium94-03/papers/1995/aspdac95/pdffiles/3b_3.pdf>.

* cited by examiner

EFFICIENT MECHANISM IN HARDWARE AND SOFTWARE CO-SIMULATION SYSTEM

CROSS-REFERENCE TO RELATED APPLICATION

This application claims the benefit of U.S. Provisional Application No. 62/009,105, filed Jun. 6, 2014, which is hereby incorporated herein by reference.

BACKGROUND

1. Field of Art

The disclosure generally relates to the simulation of circuits, and more specifically to hardware and software co-simulation.

2. Description of the Related Art

Computer simulation of digital hardware systems has become a common technique to reduce the cost and time required for the design of such hardware systems. Simulating digital hardware allows a designer to predict the functionality and performance of the hardware prior to fabricating the hardware. As more and more digital systems incorporate a processor, including a microprocessor, a digital signal processor, or other special purpose computer processor, there has been increased effort to develop a simulation system that includes simulating the hardware and simulating the running of software on a processor that is included in the digital system. Having such a simulation system allows a designer to test the operation of software on the processor before a physical processor is available. Thus, for example, a designer may be able to start designing a system incorporating a new microprocessor before the manufacturer actually releases physical samples of the microprocessor. This clearly can save time and money.

These simulation systems that simulate hardware as well as software running on that hardware are referred to as hardware and software co-simulation systems. In hardware and software co-simulation, a hardware simulator (such as a System Verilog hardware description language simulator (HDL simulator)) is provided to simulate a hardware model/system and a software simulator (such as an Instruction Set Simulator (ISS)) is provided to simulate a software application. In the co-simulation environment, both the hardware and software simulators must communicate with each other, synchronize, and control the running state of the other simulators. The mechanisms to communicate, synchronize, and control other simulators play an important role in the performance and ease of use of the co-simulation. The different mechanisms that exist for communicating, synchronizing, and controlling are either complex in implementation or negatively affect performance due to busy-waiting synchronization techniques used.

SUMMARY

The described embodiments provide an efficient mechanism for performing hardware and software co-simulation that greatly simplifies system implementation, and improves the user controllability and ease-of-use. The mechanism includes the hardware and software co-simulators synchronizing at finite and predetermined synchronization points (e.g., five synchronization points) without using polling or busy-wait techniques. The hardware and software co-simulators run freely and independently from each other until one of the synchronization points is reached. At such point the simulators can communicate and/or control other simulation states, thereby reducing the amount of communication and control between the simulators.

In one embodiment, the co-simulators comprise instruction sets to simulate operations of the hardware and instructions sets to simulate operations of software running on the hardware. Within at least one instruction set are predefined synchronization points. When in operation the co-simulator executes the instruction sets corresponding to the hardware simulator and at the same time executes the instruction sets corresponding to the software simulator. When a simulator reaches a synchronization point within its respective instruction set, the simulators synchronize (e.g., change control and/or communicate). In one embodiment, the co-simulators control and communicate with each other using standard Verilog HDL.

In one embodiment, an HDL simulator for performing hardware and software co-simulation includes: an instruction set simulator (ISS) that simulates the software, control logic that enables the simulators to synchronize, a bus interface module, and a pin-compatible processor hardware model which is a drop-in replacement for the real processor hardware model.

The use of bus interface module in the co-simulation system allows direct pin-compatible connection to the rest of the hardware model running in the HDL simulator. This helps the co-simulation environment to hide the complexity of software simulator integration from the users, thereby improving the user controllability and ease of use.

Furthermore, the ISS is run as a separate Verilog thread within the HDL simulator. This implementation avoids costly inter-process communication (IPC) and allows the use of standard Verilog semaphore for controlling the simulation run and the use of standard Verilog DPI for the communication between simulators.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

For a system on a chip (SoC) design, a hardware model of a processor running in a hardware description language (HDL) simulator is very slow to execute application software. That's the reason why many users need a faster software simulation solution, such as an ISS model, to execute application software, while the rest of the SoC design continues to simulate in the HDL simulator. An instruction set simulator (ISS) model is a simulation model that mimics the behavior of a target processor by reading instructions that are then used to maintain representations of the target processor's registers. The simulation environment that includes a software simulator and a hardware simulator is referred to as hardware and software co-simulation.

Figure 1:
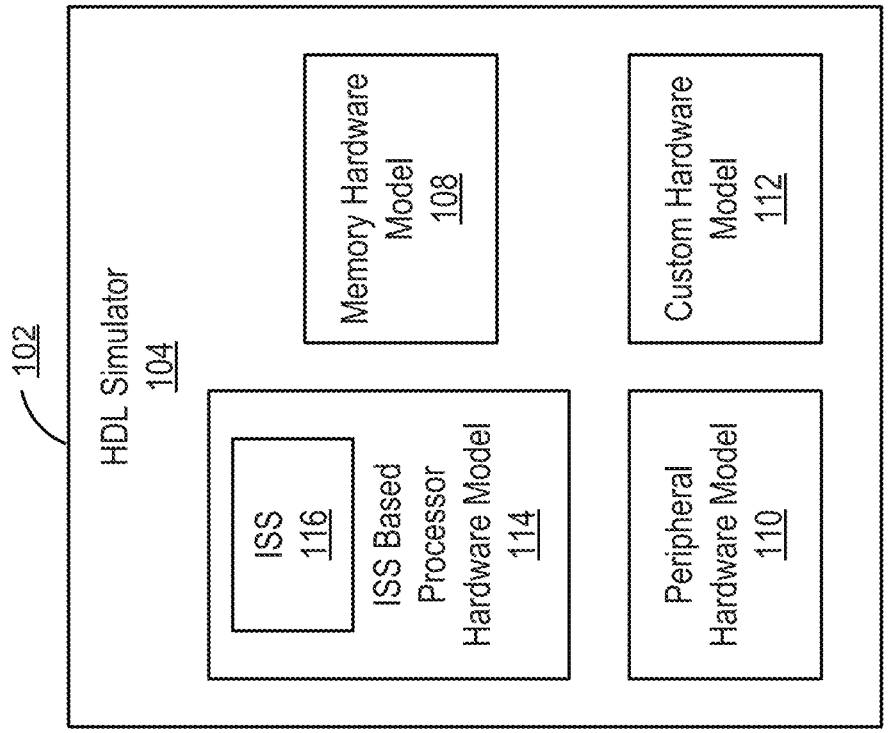
FIG. 1 is a block diagram illustrating hardware simulation and hardware co-simulation environments, according to one embodiment.
Figure 1:
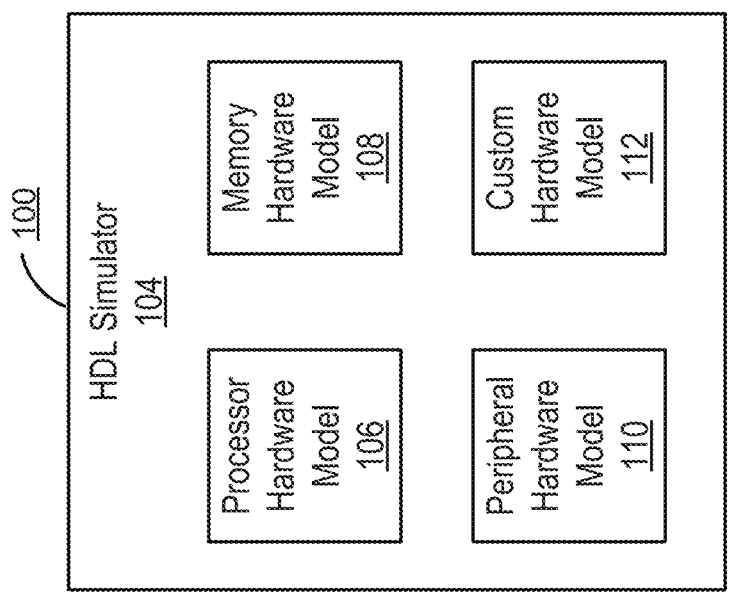

FIG. 1 demonstrates an example of a typical hardware simulation environment 100 being transformed to a hardware and software co-simulation environment 102. The typical hardware simulation environment 100 includes a HDL Simulator 104 that simulates a hardware system (e.g., SoC design). The HDL simulator 104 includes models of multiple hardware components. Specifically, the HDL simulator 104 includes a processor hardware model 106, a memory hardware model 108, a peripheral hardware model 110, and a custom hardware model 112. In the co-simulation environment 102, the processor hardware model 106 is replaced by an ISS based processor hardware model 114 (pin-compatible processor model) which embeds an ISS 116 that is transparent to users. The ISS 116 simulates software running on the ISS based processor hardware model 114. The embedded ISS 116 can execute application software at an order of magnitude faster than the hardware models. That's why the co-simulation environment 102 helps speed up the overall performance of the hardware system simulation. However, the co-simulation environment 102 poses a few challenges where the two simulators have to synchronize, communicate, and control each other during the simulation.

In the hardware and software co-simulation environment 102, the ISS 116 is run as a thread inside and as part of the HDL simulator 104 to avoid using an inter-process communication (IPC) channel between the ISS 116 and the HDL simulator 104 which is a costly communication method. An IPC channel is used for the exchange of data among multiple threads in one or more processes. Processes may be running on one or more computers connected by a network. IPC methods are divided into methods for message passing, synchronization, shared memory, and remote procedure calls (RPC). The method of IPC used may vary based on the bandwidth and latency of communication between the threads, and the type of data being communicated In one embodiment, run control of the ISS 116 is hidden from users to improve the ease of use. Advantageously, in this embodiment users need only to continue to use the HDL simulator's 104 run control.

To synchronize the threads, the present embodiments provide an efficient, streamlined synchronization mechanism with finite and predetermined synchronization points (e.g., five synchronization points) that greatly improve the effectiveness of the hardware and software co-simulation environment.

Figure 2:
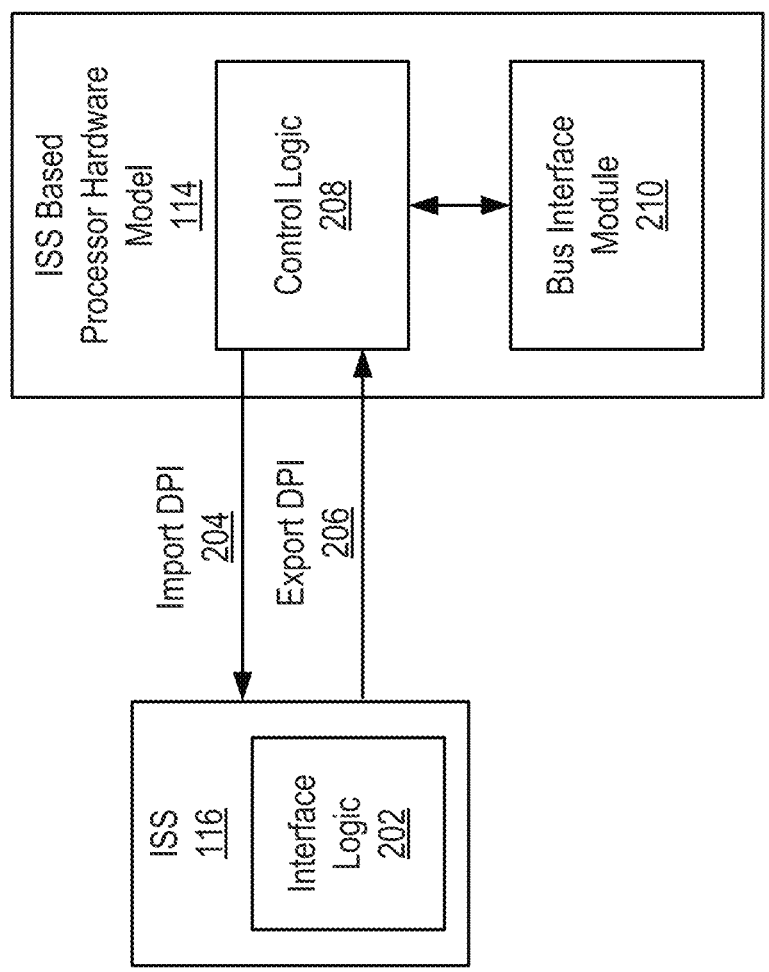
FIG. 2 is a block diagram illustrating the architecture of an ISS based processor hardware model, according to one embodiment.

The detailed architecture of the ISS based processor hardware model 114 of the processor is shown in FIG. 2. The architecture includes the two main blocks: 1) the ISS 116 and 2) the ISS based processor hardware model 114. The ISS 116 is a foreign object which is imported into the HDL simulator 104. It is running as a separate thread and concurrently with the HDL simulator 104. The ISS based processor hardware model 114 is the replacement of the processor hardware model 106 (e.g., written in System Verilog HDL). The ISS based processor hardware model 114 is running as a different thread within the HDL simulator 104. However, it should be noted that other configurations are not excluded.

The ISS 116 includes an interface logic 202 that serves as the interface layer and encapsulates the ISS integration. Inputs and outputs of the ISS 116 pass through the interface logic 202. In one embodiment, run-control (stop, step, run, etc.) is not used for the ISS 116 because the ISS 116 is always in running mode. The ISS 112 provides a set of application program interfaces (APIs) which are also the imported direct programming interfaces (DPIs) 204 in the HDL simulator 104. The HDL simulator 104 uses the import DPIs 204 to drive the inputs and the parameters to the ISS 116. The outputs from the ISS 116 are handled by the interface logic 202 using the HDL simulator 104 export DPIs 206. The use of the import and export DPIs 204 and 206 simplify the communication between the HDL simulator 104 and ISS 116, which is much more efficient that the IPC method. An implementation of the ISS 112 is the use of the SystemC wrapper and the standard TLM (Transaction Level Model) as the interface to the ISS 116.

The ISS based processor hardware model 114 includes two major sub blocks: 1) the control logic 208 and 2) the bus interface module 210. The control logic 208 efficiently handles synchronization between the HDL simulator 104, the ISS 116, and the bus interface module 210. The bus interface module 210 provides the pin-compatible interface of the processor buses.

The bus interface module 210 is a hardware model of the processor bus. The bus interface module 210 is running as another separate thread within the HDL simulator 104. The bus interface module 210 converts a bus transaction into a pin level interface which can be connected directly to the pins of the other devices in the hardware system, such as a memory and peripheral devices of the hardware system. For example, when the ISS 116 performs a memory write, the ISS 116 will invoke an export DPI 206 call to the ISS based processor hardware model 114 which in turn sends the bus write transaction to the bus interface module 210 to perform an actual bus write protocol to the memory hardware model 108.

The control logic 208 is the main thread in the HDL simulator 104 session that handles the HDL simulator 104 run control (e.g. run, step, stop, etc.). The control logic 208 includes the mechanism to synchronize, control, and communicate between the HDL simulator 104, the ISS 116, and the bus interface module 210.

In one embodiment, the control logic 208 is written in Verilog with the use of the standard Verilog semaphore which is an effective technique to hold off other simulator threads from running. The semaphore is very efficient because it does not use the polling, busy-wait, or request-acknowledge technique to control the simulator threads. In addition, the control logic 208 makes use of the standard System Verilog import and export DPIs which is much more efficient mean to transfer data between threads and the IPC.

In one embodiment, the control logic 208 is created and run first as the main thread at the start of the simulation of the hardware system. During an initialization stage, the control logic 208 creates both the ISS 116 and the bus interface module 210. The control logic 208 then lets the ISS 116 and the bus interface module 210 run freely. The ISS 116, bus interface module 210, and control logic 208/main thread are synchronized at 5 synchronization points. The synchronizations points are the events that happen during simulation, in which time threads are synchronized (e.g., threads communicate with each other and the control can change hands). The synchronization points are:

1) When reset assert/de-assert. For example, after a reset the ISS 116 is stopped and the control logic 208 communicates with the ISS 116 via an import DPI 204 to instruct it to start running.
2) When a bus transaction is started. For example, if the ISS 116 is processing a read request from memory, the ISS 116 provides the read request to the control logic 208 via an export DPI 206. The control logic 208 forwards the read request to the bus interface module 210 so that the requested data can be read from the memory hardware model 108.
3) When a bus transaction is complete. For example, after bus interface module 210 obtains requested data from the memory hardware model 108, the bus interface module 210 provides the requested data to the control logic 208. The control logic 208 forwards the requested data to the ISS 116 via an import DPI 204.
4) When the processor is in sleep mode, such as Wait for Interrupt (WFI) or Wait for Event (WFE). For example, the control logic 208 may communicate with the ISS 116 via an import DPI 204 to instruct the ISS 116 to go into sleep mode. In one embodiment, in sleep mode, the processor enters a lower power state to reduce power consumption.
5) When the processor awakes/exits from sleep mode, such as when an interrupt or event is sent by another device. For example, the control logic 208 receives an interrupt from the bus interface module 210 and the control logic 208 instructs the ISS 116 via an import DPI 204 to wake up.

When the hardware system (e.g., SOC design) simulated by the HDL simulator 104 has a timer, it has to advance its clock at every number of software instructions executed. Hence, when the hardware system has a timer, another (a sixth) synchronization point is also used. The sixth synchronization point is the ratio between a number of instruction (M) and number of clocks (N) that the timer advanced, N clocks for every M number of instructions executed.

Figure 3:
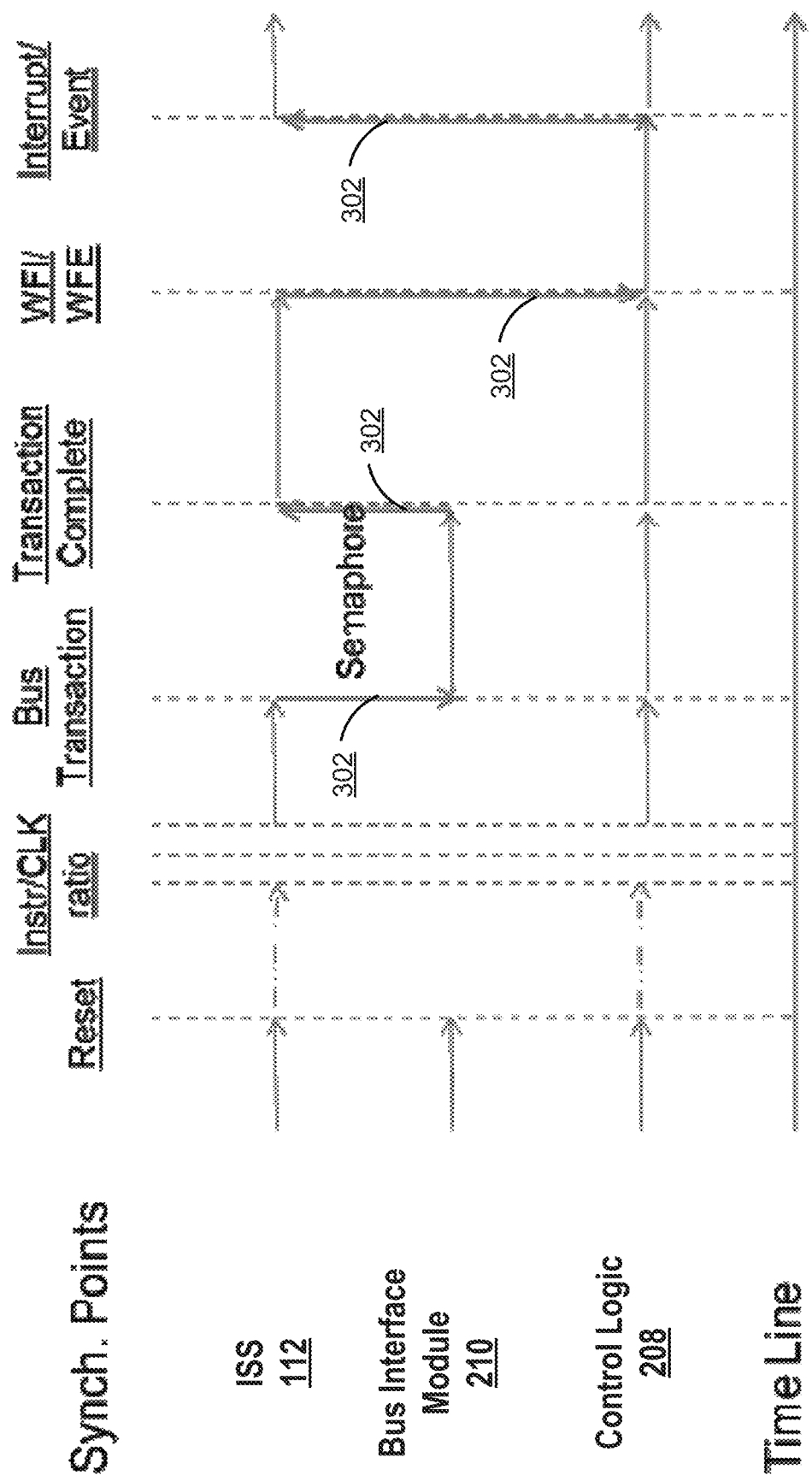
FIG. 3 is a diagram illustrating synchronization points and simulation thread correlation, according to one embodiment.

FIG. 3 demonstrates the synchronization points versus the execution of simulation threads and how they are correlated with each other. The broken vertical lines in the figure indicated when the synchronization points occur: reset, instruction/clock ratio (instr/CLK ratio), a bus transaction started (bus transaction), a bus transaction is complete (transaction complete), processor is in sleep mode (WFI/WFE), and the processor awakes from sleep mode (interrupt/event). The solid horizontal lines indicate the thread is running with respect to a simulation time line. Vertical lines 302 indicate a thread is releasing the semaphore of another thread to trigger/allow that thread to run.

As shown in the FIG. 3, the control logic 208 is always running, unless the (6th) instruction/clock ratio synchronization point is used. In that case, the main thread 212 may wait for the ISS 112 to complete the M number of instructions (as shown in the dotted horizontal line between reset and instr/CLK ratio. The control logic 208 is also the same thread that runs other hardware models (e.g. memory and peripheral devices). It can be the slowest thread running in the co-simulation environment. For this reason it is best that the thread not stop or slow down.

The bus interface module 210 is mostly idle. It only runs during the bus transaction start and complete, in which time the ISS 112 stops and waits for the bus interface module 210 to perform the transaction and sends back the transaction results to the ISS 116 via the control logic 208. When the processor enters into the sleep mode (WFI/WFE), the ISS 116 enters into sleep mode. The ISS 116 waits for an event or an interrupt to be sent from another device to cause it to awake from sleep mode.

When simulation begins, all threads are created and initialize themselves and then wait until the reset de-asserts. After that point, the control logic 208 and the ISS 116 will continue to run until any of the synchronization points occurs and they can occur at any order.

The following is the detailed algorithm of the synchronization mechanism that is used to hold the thread from running using the semaphore:

At reset, the ISS 112 holds 104 the bus interface module 210 semaphore (the bus interface module 210 stops) until the ISS 116 has a bus transaction to be processed by the bus interface module 210.

When bus transaction starts, the ISS 112 releases the bus interface module 210 semaphore and the bus interface module 210 starts to run. The bus interface module 210 then holds the ISS 116 semaphore until transaction completes and results are ready.

When the bus transaction is complete, the bus interface module 210 releases the ISS 116 semaphore so that the ISS 112 can start to run again. The ISS 112 then hold the bus interface module 210 semaphore.

When ISS 112 enter into sleep mode (it is in WFI/WFE mode), the control logic 208 holds the ISS 116 semaphore until an interrupt/event arrives from another device.

When users desire to have the 6th synchronization point (synch with #instructions/#Cycles ratio), the control logic 208 inserts an ISS call-back after M number of instructions, then holds the ISS 116 semaphore for the N number of clock cycles.

When the threads are running, they do not communicate or exchange any data between the threads. All communications are exchanged only at a synchronization point. For example, an ISS input signal sent from an external device will be sent to the ISS 116 only at the synchronization points.

In summary, the synchronization mechanism is very efficient by using a finite synchronization points. Together with the use of standard Verilog Semaphore and DPIs, thread control and communication between simulator threads is simplified. The hardware and software co-simulation environment 102 which uses the described embodiments becomes much more effective. And with the use of the bus interface module 210, the ISS based processor hardware model 114 can be a drop-in replacement model. Thereby, it improves the co-simulation ease of use.

Computing Machine Architecture

Figure 4:
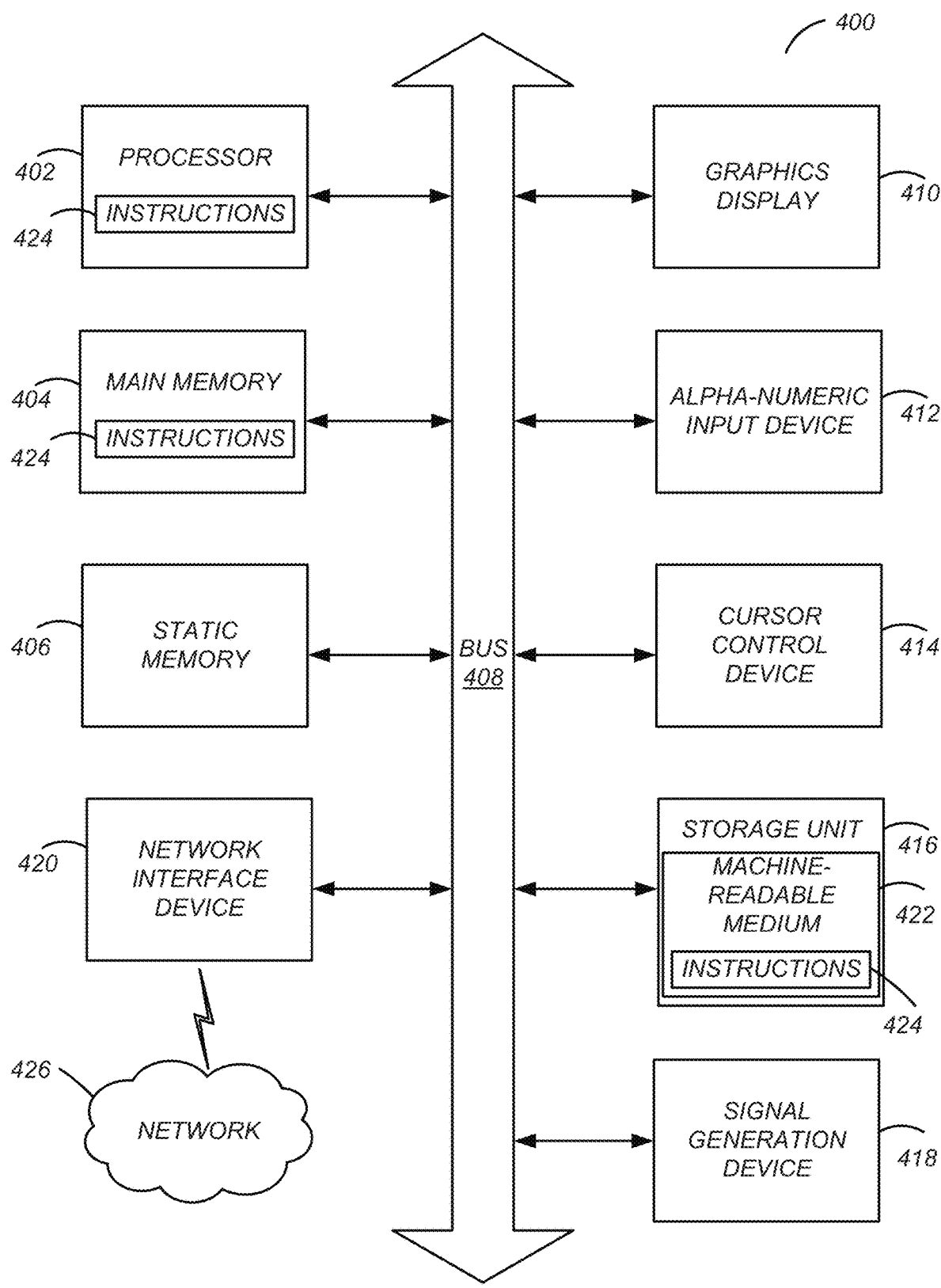
FIG. 4 is a block diagram illustrating components of an example machine, according to one embodiment.

Turning now to FIG. 4, it is a block diagram illustrating components of an example machine able to read instructions from a machine-readable medium and execute them in a processor (or controller). Specifically, FIG. 4 shows a diagrammatic representation of a machine in the example form of a computer system 400 within which instructions 424 (e.g., software or program code) for causing the machine to perform (execute) any one or more of the methodologies described with FIGS. 1-3. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions 424 (sequential or otherwise) that specify actions to be taken by that machine. Further, while only a single machine is illustrated, the term "machine" shall also be taken to include any collection of machines that individually or jointly execute instructions 424 to perform any one or more of the methodologies discussed herein.

The example computer system 400 includes a processor 402 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 404, and a static memory 406, which are configured to communicate with each other via a bus 408. The computer system 400 may further include graphics display unit 410 (e.g., a plasma display panel (PDP), a liquid crystal display (LCD), a projector, or a cathode ray tube (CRT)). The computer system 400 may also include alphanumeric input device 412 (e.g., a keyboard), a cursor control device 414 (e.g., a mouse, a trackball, a joystick, a motion sensor, or other pointing instrument), a storage unit 416, a signal generation device 418 (e.g., a speaker), and a network interface device 420, which also are configured to communicate via the bus 408.

The storage unit 416 includes a machine-readable medium 422 on which is stored instructions 424 (e.g., software) embodying any one or more of the methodologies or functions described herein. The instructions 424 (e.g., software) may also reside, completely or at least partially, within the main memory 404 or within the processor 402 (e.g., within a processor's cache memory) during execution thereof by the computer system 400, the main memory 404 and the processor 402 also constituting machine-readable media. The instructions 424 (e.g., software) may be transmitted or received over a network 426 via the network interface device 420.

While machine-readable medium 422 is shown in an example embodiment to be a single medium, the term "machine-readable medium" should be taken to include a single medium or multiple media (e.g., a centralized or distributed database, or associated caches and servers) able to store instructions (e.g., instructions 424). The term "machine-readable medium" shall also be taken to include any medium that is capable of storing instructions (e.g., instructions 424) for execution by the machine and that cause the machine to perform any one or more of the methodologies disclosed herein. The term "machine-readable medium" includes, but not be limited to, data repositories in the form of solid-state memories, optical media, and magnetic media.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in FIGS. 1-4. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors, e.g., processor 402, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for efficient power analysis of a digital circuit through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer-implemented method for hardware and software co-simulation comprising:
   executing, on circuitry, a main thread of a hardware simulator simulating a hardware system according to a hardware instruction set comprising a first set of synchronization points, wherein each synchronization point of the first set is one of a plurality of predefined synchronization points;
   creating, by the main thread, a software simulation thread and a bus interface thread within the hardware simulator, the software simulation thread simulating software running on the hardware system and the bus interface thread simulating a bus of the hardware system;
   executing the software simulation thread and the bus interface thread according to a software instruction set comprising a second set of synchronization points, wherein each synchronization point of the second set is one of the plurality of predefined synchronization points; and
   synchronizing at least two of the main thread, the software simulation thread, and the bus interface thread in response to determining that one of the hardware instruction set and the software instruction set has reached a synchronization point of one of the first set of synchronization points and the second set of synchronization points, wherein the plurality of predefined synchronization points comprise:
   a reset,
   a start of a bus transaction,
   an end of a bus transaction,
   entering a sleep mode, and
   ending a sleep mode.

2. The method of claim 1, wherein the reached synchronization point is a reset, and synchronizing in response to the reset comprises:
   transmitting, by the main thread to the software simulation thread via an import direct programing interface, an instruction to run in response to a reset of the hardware simulator.

3. The method of claim 1, wherein the reached synchronization point is a start of a bus transaction, and synchronizing in response to the start of a bus transaction comprises:
   identifying, by the software simulation thread, the bus transaction;
   transmitting, by the software simulation thread to the main thread via an export direct programing interface, a request for execution of the bus transaction; and
   transmitting, by the main thread to the bus interface thread, the request for execution of the bus transaction.

4. The method of claim 1, wherein the reached synchronization point is the end of a bus transaction, and synchronizing in response to the end of a bus transaction comprises:
   receiving, by the main thread from the bus interface thread, information associated with the execution of the bus transaction; and transmitting, by the main thread to the software simulation thread via an import direct programing interface, the information associated with the execution of the bus transaction.

5. The method of claim 1, wherein the reached synchronization point is entering a sleep mode, and synchronizing in response to entering the sleep mode comprises:
responsive to determining that a simulated processor is in sleep mode, transmitting, by the main thread to the software simulation thread via an import direct programing interface, an instruction for the software simulation thread to wait for an event.

6. The method of claim 1, wherein the reached synchronization point is ending a sleep mode, and synchronizing in response to ending the sleep mode comprises:
responsive to determining that a simulated processor has ended sleep mode, transmitting, by the main thread to the software simulation thread via an import direct programing interface, an instruction for the software simulation thread to run.

7. The method of claim 1, further comprising:
synchronizing the main thread and the software simulation thread in response to the software simulation thread executing a set number of instructions in the software instruction set; and
synchronizing the main thread and the software simulation thread in response to hardware simulator simulating a set number of clock cycles of the hardware system.

8. The method of claim 1, wherein the software simulation thread is an instruction set simulator embedded in a processor hardware model of the hardware simulator.

9. The method of claim 1, wherein control of the hardware simulator is available to users and control of the software simulation thread is not available to users.

10. A computer-implemented method for hardware and software co-simulation comprising:
executing, on circuitry, a hardware simulator simulating a hardware system according to a hardware instruction set comprising a first set of synchronization points, wherein each synchronization point of the first set is one of a plurality of predefined synchronization points;
executing, on circuitry, a software simulator simulating software running on the hardware system according to a software instruction set comprising a second set of synchronization points, wherein each synchronization point of the second set is one of the plurality of predefined synchronization points, the software simulator executed concurrent with the hardware simulator; and
synchronizing the hardware simulator with the software simulator in response to determining that one of the hardware instruction set and the software instruction set has reached a synchronization point of one of the first set of synchronization points and the second set of synchronization points, wherein the plurality of predefined synchronization points comprise:
a reset,
a start of a bus transaction,
an end of a bus transaction,
entering a sleep mode, and
ending a sleep mode.

11. The method of claim 10, wherein the software simulator is executed as a thread of the hardware simulator.

12. The method of claim 10, wherein the hardware simulator comprises a bus interface thread and a main thread, the bus interface thread simulating a processor bus and the main thread processing run control of the hardware simulator.

13. The method of claim 10, wherein the hardware simulator and the software simulator synchronize through direct programming interfaces.

14. The method of claim 10, wherein the reached synchronization point is a reset of the hardware simulator, and synchronizing comprises:
transmitting, by a main thread of the hardware simulator to the software simulator via an import direct programing interface, an instruction to run in response to the reset.

15. The method of claim 10, wherein the reached synchronization point is a start of a bus transaction, and synchronizing comprises:
identifying, by the software simulator, the bus transaction;
transmitting, by the software simulator to a main thread of the hardware simulator via an export direct programing interface, a request for execution of the bus transaction; and
transmitting, by the main thread to a bus interface thread, the request for execution of the bus transaction, the bus interface thread simulating a bus of the hardware system.

16. The method of claim 10, wherein the reached synchronization point is an end of a bus transaction, and synchronizing comprises:
receiving, by a main thread from a bus interface thread information associated with the execution of the bus transaction; and
transmitting, by the main thread to the software simulator via an import direct programing interface, the information associated with the execution of the bus transaction.

17. The method of claim 10, wherein the reached synchronization point is entering a sleep mode, and synchronizing comprises:
responsive to determining that a simulated processor is in sleep mode, transmitting, by a main thread of the hardware simulator to the software simulator via an import direct programing interface, an instruction for the software simulator to wait for an event.

18. The method of claim 10, wherein the reached synchronization point is ending a sleep mode, and synchronizing comprises:
responsive to determining that a simulated processor has ended sleep mode, transmitting, by the main thread of the hardware simulator to the software simulator via an import direct programing interface, an instruction for the software simulator to run.

19. A computer program product for hardware and software co-simulation, the computer program product comprising a non-transitory computer-readable storage medium containing computer program code for:
executing a hardware simulator simulating a hardware system according to a hardware instruction set comprising a first set of synchronization points, wherein each synchronization point of the first set is one of a plurality of predefined synchronization points;
executing a software simulator simulating software running on the hardware system according to a software instruction set comprising a second set of synchronization points, wherein each synchronization point of the second set is one of the plurality of predefined synchronization points, the software simulator executed concurrent with the hardware simulator; and synchronizing the hardware simulator with the software simulator in response to determining that one of the hardware instruction set and the software instruction set has reached a synchronization point of one of the first set of synchronization points and the second set of synchronization points, wherein the plurality of predefined synchronization points comprise:
a reset,
a start of a bus transaction,
an end of a bus transaction,
entering a sleep mode, and
ending a sleep mode.

20. A computer-implemented method for hardware and software co-simulation comprising:
executing, on circuitry, a main thread of a hardware simulator simulating a hardware system according to a hardware instruction set comprising a first set of synchronization points, wherein each synchronization point of the first set is one of a plurality of predefined synchronization points;
executing a software simulation thread within the hardware simulator, the software simulation thread including an instruction set simulator and simulating software running on the hardware system, according to a software instruction set comprising a second set of synchronization points, wherein each synchronization point of the second set is one of the plurality of predefined synchronization points; and
synchronizing the main thread and the software simulation thread in response to determining that one of the hardware instruction set and the software instruction set has reached a synchronization point of one of the first set of synchronization points and the second set of synchronization points, wherein the synchronization of the main thread and the software simulation thread is maintained while the hardware simulation thread is executed according to the hardware instruction set and while the software simulation thread is executed according to the software instruction set, wherein the plurality of predefined synchronization points comprise:
a reset,
a start of a bus transaction,
an end of a bus transaction,
entering a sleep mode, and
ending a sleep mode.

* * * * *